United States Patent [19]
Liu et al.

[11] Patent Number: 6,091,636
[45] Date of Patent: Jul. 18, 2000

[54] FLASH MEMORY CELL AND A NEW METHOD FOR SENSING THE CONTENT OF THE NEW MEMORY CELL

[76] Inventors: David K. Y. Liu, 470 Tumbleweed Ct., Fremont, Calif. 94539; Wenchi Ting, 4837 Lago Vista Cir., San Jose, Calif. 95129

[21] Appl. No.: 09/417,234

[22] Filed: Mar. 26, 1998

Related U.S. Application Data

[62] Division of application No. 08/735,384, Oct. 21, 1996, Pat. No. 5,751,631.

[51] Int. Cl.[7] .............................. G11C 16/04; G11C 16/06
[52] U.S. Cl. ................................ 365/185.19; 365/185.21
[58] Field of Search .................... 365/185.19, 185.21, 365/185.17, 185.33

[56] References Cited

U.S. PATENT DOCUMENTS

| | | | |
|---|---|---|---|
| 5,617,357 | 4/1997 | Haddad et al. | 365/185.27 |
| 5,694,356 | 12/1997 | Wong et al. | 365/185.03 |
| 5,805,499 | 9/1998 | Haddad | 365/185.19 |

*Primary Examiner*—Son Mai
*Attorney, Agent, or Firm*—Sawyer Law Group LLP

[57] ABSTRACT

A method for sensing the content of a FLASH memory cell, and a new FLASH memory cell structure that is suitable for use with this new sensing scheme. In a first aspect, a semiconductor memory cell comprises a lightly doped n-region including a channel region; a first insulating layer overlying portions of said n-region; a floating gate overlying said first insulating layer; a second insulating layer overlying said floating gate; and a control gate overlying second insulating layer.

1 Claim, 9 Drawing Sheets

FLASH MEMORY CELL AND A NEW METHOD FOR SENSING THE CONTENT OF THE NEW MEMORY CELL

This application is a divisional of application Ser. No. 08/735,384, filed Oct. 21, 1996 now U.S. Pat. No. 5,751,631.

FIELD OF THE INVENTION

The present invention relates to a new method for sensing the memory content of a FLASH memory cell, and a corresponding new integrated circuit FLASH memory device that is most suitable for this new method of sensing.

BACKGROUND OF THE INVENTION

High-density FLASH memory devices are used as non-volatile embedded memory or mass-storage devices. For either application, minimizing cell size while maintaining process simplicity is a top priority since every memory chip contains a large number (several million, for example) of cells in arrays which occupy most of the die. A smaller cell translates into a smaller die size and consequently lower manufacturing costs for each die. This is crucial if FLASH memory is to replace magnetic disk drive in mass storage applications.

The two popular types of architecture for high-density FLASH memory are the NAND, which utilizes Fowler-Nordheim (FN) tunneling for both write and erase, and the NOR, which uses channel hot-electron programming and FN tunneling erasure. In recent years, the NAND-type FLASH memory architecture has emerged as the most promising candidate to target the mass storage application. NAND architecture has the distinct advantage of a smaller cell size compared to the other popular NOR-type FLASH memory architecture. The reading or sensing of the content of the data stored in either the NAND-type FLASH cell or NOR-type FLASH cell has been described in other invention disclosures and should be obvious to ones skilled in the art.

One of the main drawbacks of such schemes, which is also a common cause of read error in NAND-type FLASH devices, is that the amount of current sensed by the bitline is not only a function of the content of the selected cell, but it also depends on the content of the other unselected cells that is connected in series together. For example, FIG. 1 illustrates the situation where the selected cell is the last cell is a serial connection of 8 NAND cells together. Assuming the floating gate of the selected cell is depleted of electrons, a channel resistance of about 10 KOhm is associated with the selected cell. If the floating gate of all the unselected cells are programmed, or filled with electrons, the channel resistance for the remaining 7 cells will be about 100 KOhm. This tends to reduce significantly the amount of current that can be sensed by the bitline and leads to a read error since the selected cell can be easily interpreted as "programmed" or filled with electrons due to the high series resistance associated with the other 7 unselected cells. In addition, using the static current to traverse through the high channel resistance will lead to long delay time and high power consumption. This problem has limited the usefulness of NAND architecture to serial access applications. This present invention addresses this problem by proposing a method of displacement current sensing as a way to sense the content of a FLASH memory cell. In addition, the present invention also proposes a new FLASH memory cell structure that is most suitable to be used with the new displacement current sensing scheme.

SUMMARY OF THE INVENTION

The present invention is directed toward a novel displacement current sensing scheme as a way to sense the content of a FLASH memory cell, and a new FLASH memory cell structure that is most suitable to be used with this new sensing scheme. To more particularly describe the features and advantages of the present invention, refer to the following discussion in conjunction with the accompanying figures.

DETAILED DESCRIPTION

The present invention relates to a new method for sensing the memory content of a FLASH memory cell, and a corresponding new integrated circuit FLASH memory device that is most suitable for this new method of sensing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiment. Thus, the present invention is not intended to be limited to the embodiment shown but is to be accorded the widest scope consistent with the principles and features described herein.

For this disclosure, the invention is discussed in the context of NAND architecture. Extension of this disclosure into NOR architecture should also be applicable, and is straightforward for those skilled in the art.

Figure 1:
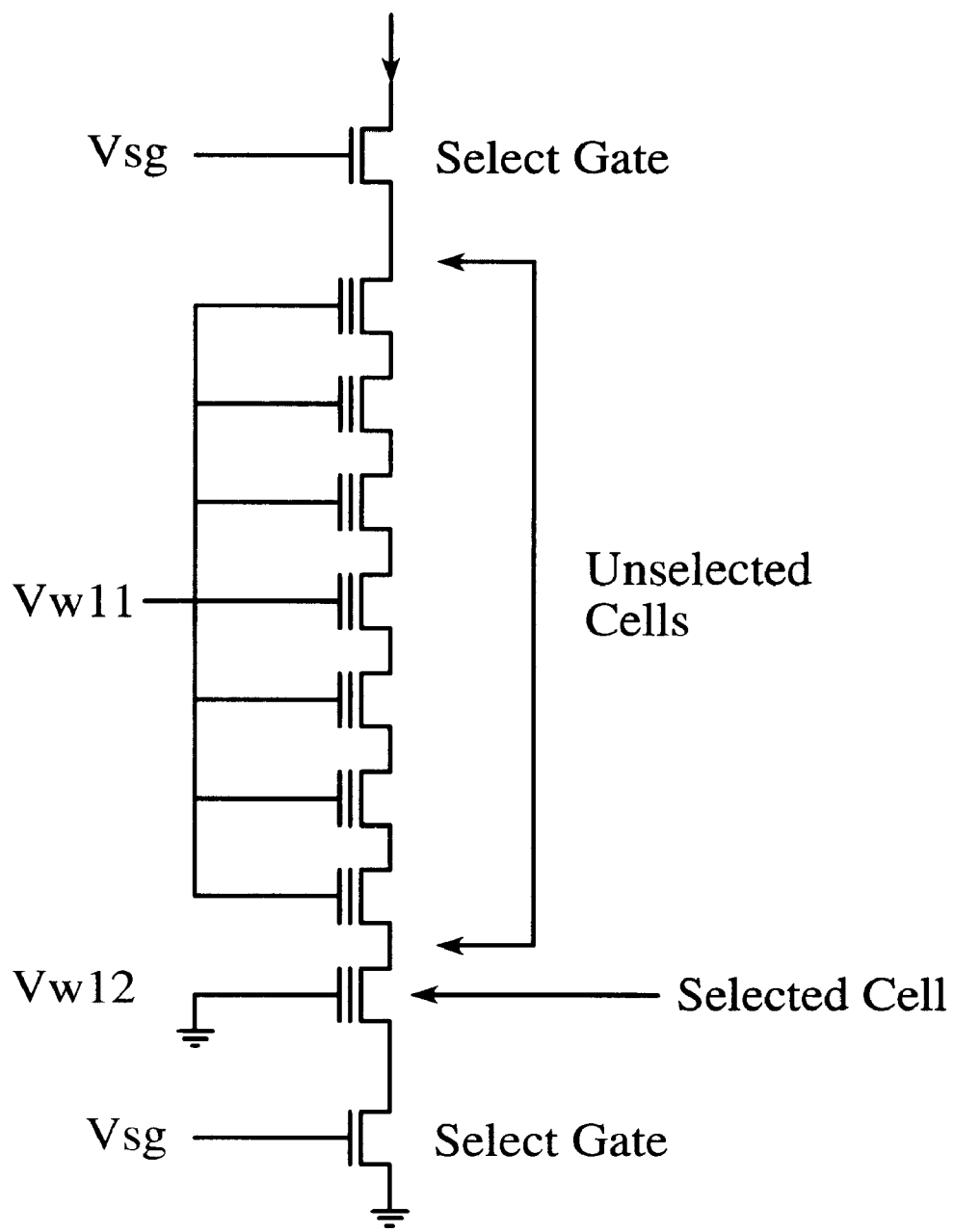
FIG. 1 is a diagram illustrating read operation of a FLASH cell in a NAND array. The cell at the bottom (with its control gate grounded) is the selected cell.
Figure 2A:
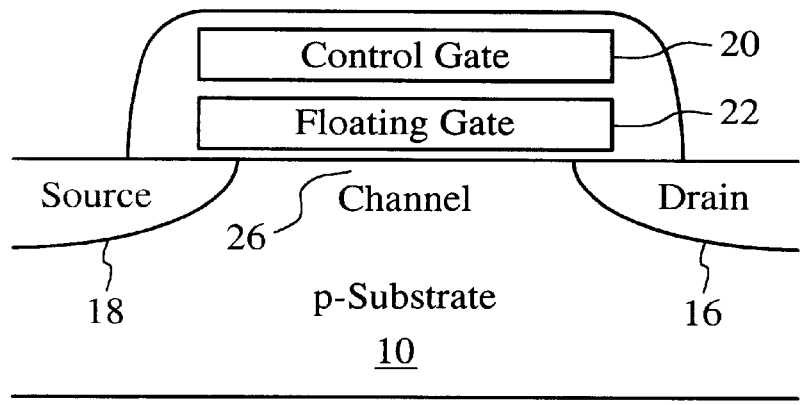
FIG. 2(A) is a cross-sectional schematic of a prior art ETOX cell where the cell is placed in the p-substrate.

The present invention comprises a new cell structure and a new method to access the logic state stored in such cells. The present invention solves the challenges in scaling conventional FLASH cell transistors. Cross-sectional schematic of the prior-art ETOX cell which is commonly used in the prior art NOR and NAND FLASH technologies is illustrated in FIGS. 2(A), (B), and (C). The invented cell features a stacked-gate structure similar to the ETOX cell, as shown in FIGS. 3(A) through (F). But instead of having a lightly doped p-type channel region (26 in FIG. 2) as in prior art, the preferred embodiment of this cell features a lightly doped n-type channel 112 on top of an optional layer of heavily doped n+ region (see FIG. 3(C)). The doping concentration of this lightly doped n-type channel is in the range of $10^{12}$ to $10^{14}$ cm$^{-2}$, the doping concentration of the heavily doped n+ region is in the range of $10^{14}$ to $10^{16}$ cm$^{-2}$.

Program and erase of cell 100 may both be carried out using FN tunneling as in prior art. Reading of cell 100 is accomplished through the technique illustrated in FIG. 6. Depending on the net charge stored on the floating gate 110 (in FIG. 3(A)), either an accumulation or a depletion region would be present at the channel surface and confined within the n- region, if the control gate voltage during read is properly chosen. The total capacitance seen from the control gate of this system is determined by whether the channel surface is accumulated or depleted. This capacitance is therefore determined by the logic state that is stored in the cell. It is straightforward to one skilled in the art that the displacement current into any capacitor is directly proportional to its capacitance. The sensing circuitry senses the displacement current from the bitline and determines the logic state, by comparing this displacement current with some appropriately chosen reference current. This new read technique would significantly reduce the DC power consumption, and make it attractive for low power applications.

Figure 2B:
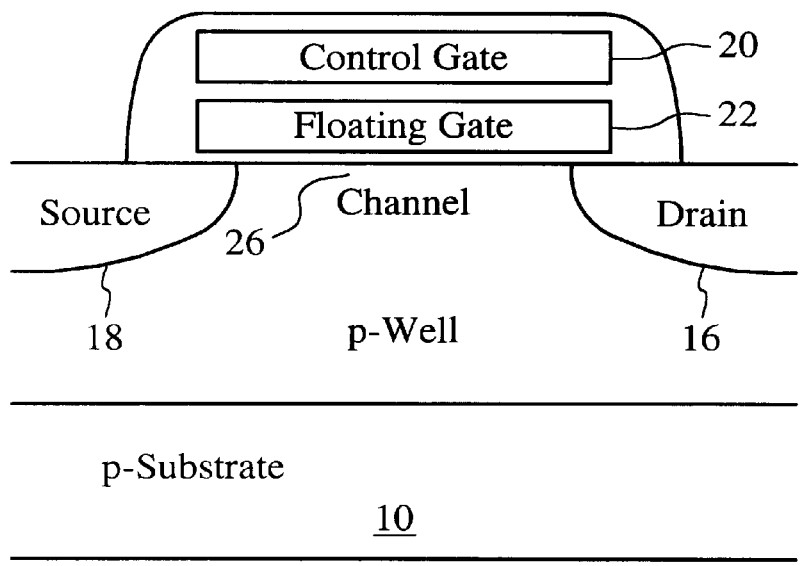
FIG. 2(B) is a cross-sectional schematic of a prior art ETOX cell where the cell is placed in a p-well inside the p-substrate.
Figure 2C:
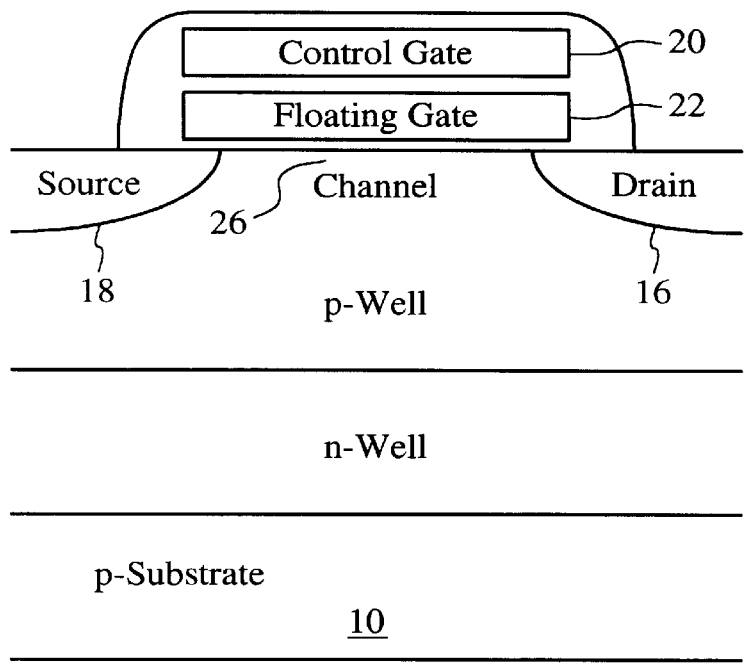
FIG. 2(C) is a cross-sectional schematic of a prior art ETOX cell where the cell is placed in a p-well inside an n-well. The n-well itself is in the p-substrate.
Figure 3A:
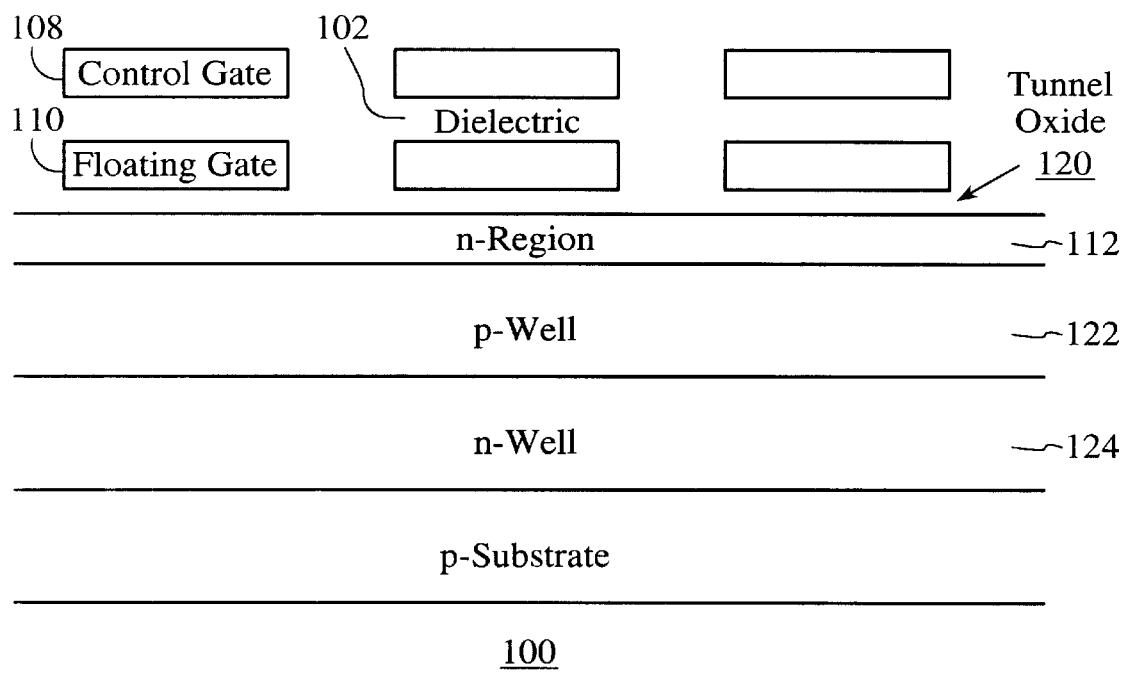
FIG. 3(A) is a cross-sectional schematic (along the bitline) of one implementation of the invented cell.
Figure 3B:
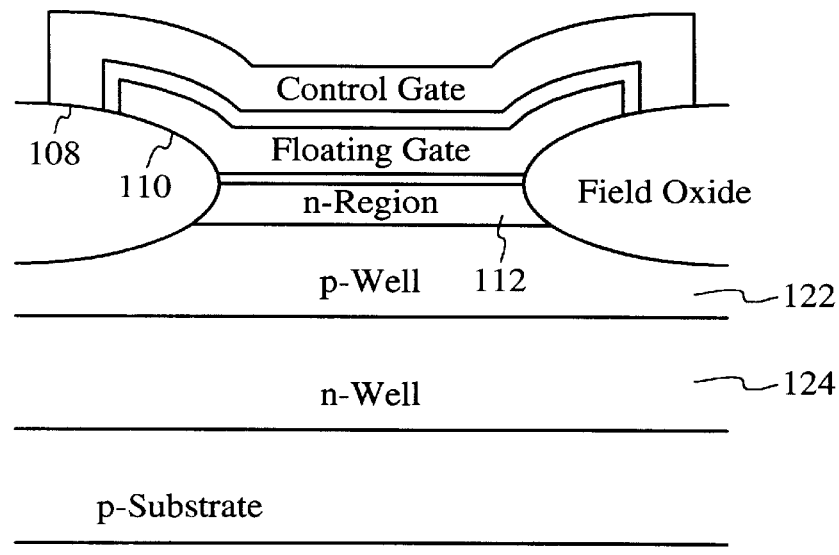
FIG. 3(B) is a cross-sectional schematic (along the wordline) of one implementation of the invented cell.
Figure 3C:
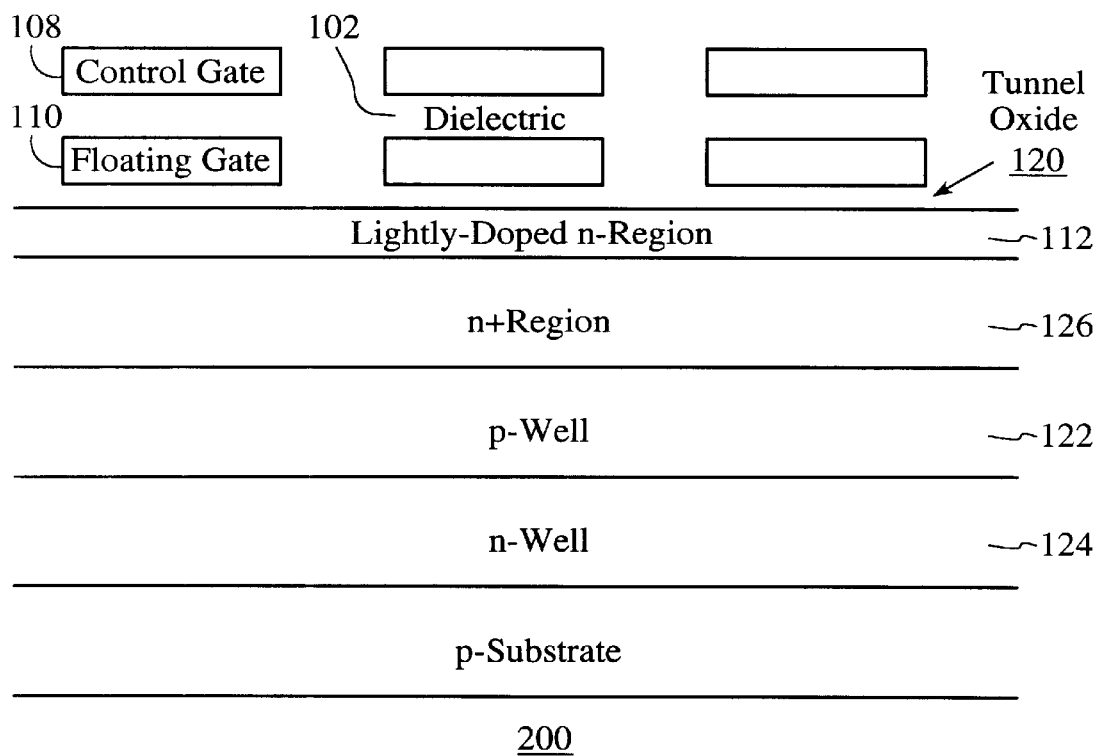
FIG. 3(C) is a cross-sectional schematic (along the bitline) of preferred implementation of the invented cell wherein an n+ region underlies the lightly-doped n− region to reduce bitline resistance.
Figure 3D:
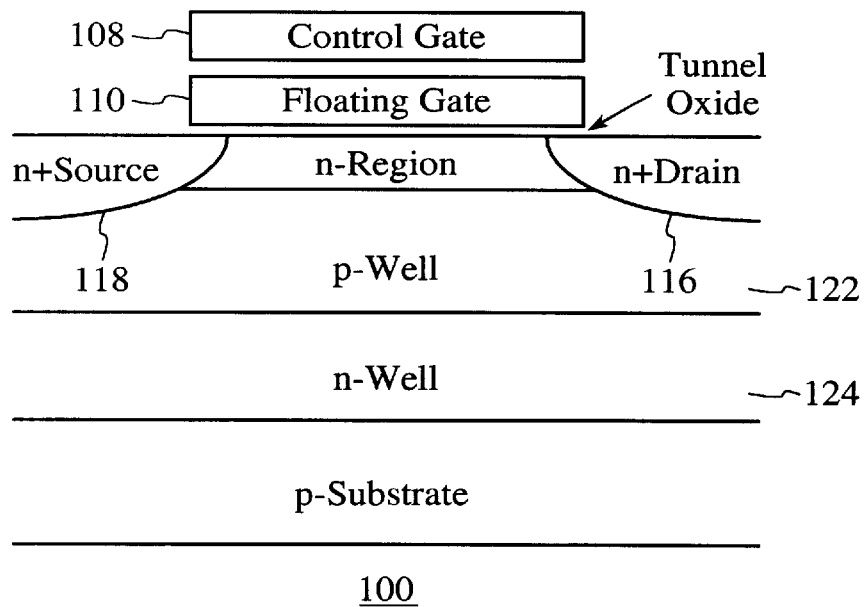
FIG. 3(D) is a diagram illustrating an implementation of cell 100 with the conventional source/drain implant.

Contrary to prior art, the channel between the drain 116 and source 118 in FIG. 3(D) is now n-type in this invention, eliminating the depletion region in the prior-art cell caused by the reverse bias between the n-type drain (region 16 in FIG. 2) and the p-type channel 26. The optional n+ region beneath the n- region reduces the bitline resistance, providing an effective conduction path for the displacement current during sensing.

Cell Structure:

A cross-section of one implementation of the cell 100 along the bitline of the cell and along the wordline of the cell is depicted in FIGS. 3(A) and (B) respectively. Comparing FIG. 2 (conventional ETOX cell 10) with FIG. 3 (this invention disclosure), it is clear that the disclosed cell is similar to the prior art ETOX cell in that it uses a double-gate structure commonly fabricated using a self-aligned polysilicon etch process, even though other fabrication techniques are not excluded. A thin layer of good insulator, preferably a composite oxide-nitride-oxide layer 102, is placed between the control and floating gates 108 and 110. This interpoly dielectric layer 102 helps to couple the voltage applied to the control gate 108 onto the floating gate 110, and to retain electrons or holes stored on the floating gate 110 by insulating the floating gate 110 from the control gate 108. The distinct feature of this invention is the lightly doped n- region 112 including the channel region. (The designation of n- region is used to denote lightly doped n type region, whereas the designation of n+ region is used to denote highly doped n type region.)

Figure 4A:
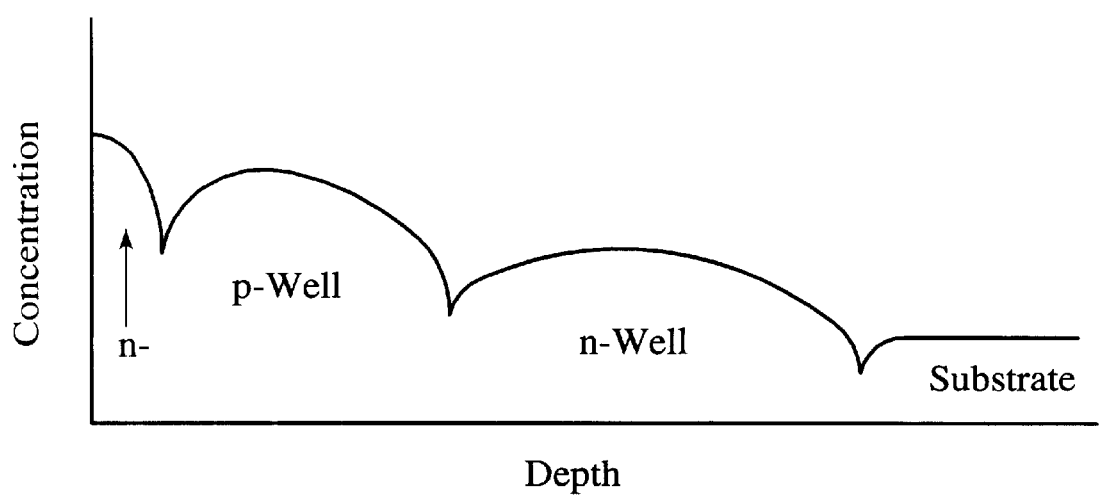
FIG. 4(A) is a diagram of a typical channel doping profile of cell 100.

In one example of embodiment, the implant dose used to form the lightly doped n- region should be in the range of $10^{12}$ to $10^{14}$ cm$^{-2}$. Such channel doping would allow the channel surface of a programmed cell (floating gate charged with electrons) to go into depletion when the control gate is appropriately biased, as will be discussed in a later section. FIG. 4(A) shows a typical doping profile in the channel for this disclosure.

The n- region 112 in FIG. 3(A) is contained by a p-well 122. Underneath the p-well 122, an n-well 124 may be needed, as shown in FIG. 3(A). This n-well is also commonly used in prior art to isolate the cells from periphery circuits. This is especially important when positive voltage is applied to the p-well for bulk or sector erase. In such conditions the cell area has to be isolated from the periphery, otherwise the positive voltage would forward bias the p-substrate to n+ junctions in the periphery and disrupts functionality of NMOS transistors in the periphery. Both the p-well and n-well may be formed using ion-implantation and diffusion to drive the dopant in, as is routinely done in prior art. If erase is done with only negative voltage on the control gate 108 without the positive p-well bias, then it would not be necessary to have p-well isolated from p-substrate with an n-well. The p-well can just be part of the doping profile of the p-substrate.

Figure 4B:
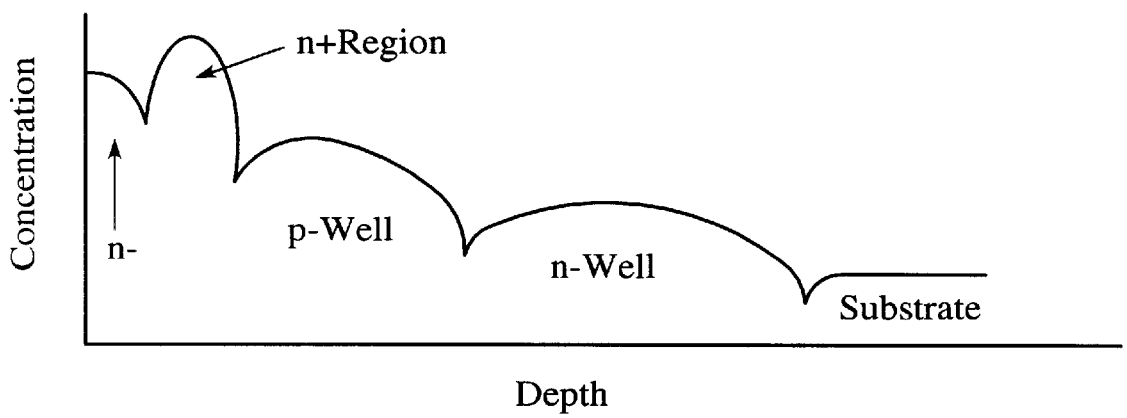
FIG. 4(B) is a diagram of a typical channel doping profile of the preferred embodiment where the heavily doped n+ region is placed underneath the lightly doped n− region.

In order to reduce bitline resistance, a buried n+ region 126 may be placed under the n- region 112 as shown in FIG. 3(C). This n+ region provides an effective conduction path for the displacement current during sensing. FIG. 4(B) illustrates the typical doping profile in the channel for the preferred embodiment that includes the optional, heavily doped n+ region underneath the lightly doped n- region. The implant dose to form this heavily doped n+ region should be in the range of $10^{14}$ to $10^{16}$ cm$^{-2}$. Furthermore, to place and limit the n+ region directly below the n- region, the implant for the n+ region can be implemented with either Arsenic or Antimony.

Figure 3E:
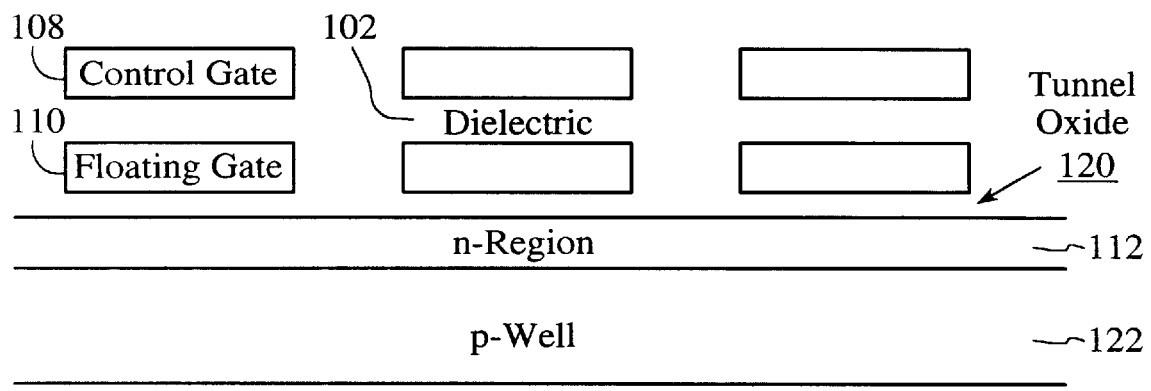
FIG. 3(E) is a diagram illustrating an implementation of cell 100 using SOI technology.

A comparison between FIGS. 2 and 3(A) reveals that the disclosed cell does not mandate separate implementation for source or drain. However, the conventional source/drain implant may still be used and would reduce the bitline resistance. An implementation of cell 100 with the source/drain implant is illustrated in FIG. 3(D). This cell may also be implemented using SOI (silicon-on-insulator) technology, where the p-well 122 in FIG. 3(A) now resides on an insulating substrate instead of the p-type Si substrate, as shown in FIG. 3(E).

Figure 3F:
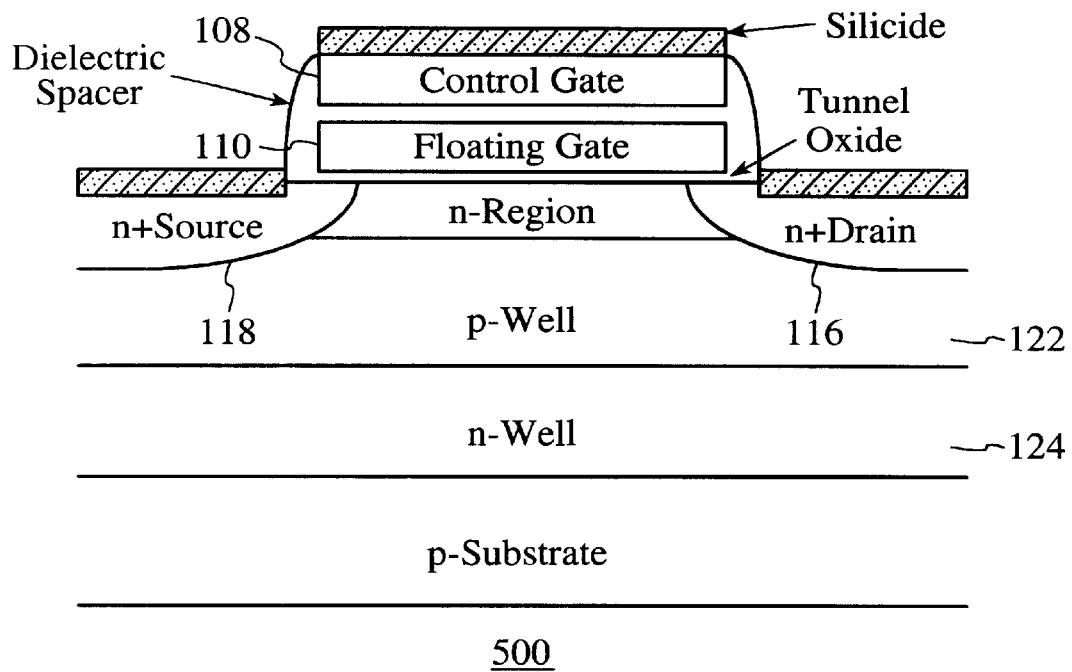
FIG. 3(F) is a diagram illustrating an implementation of cell 100 using SALICIDE technology.

Should self-aligned silicidation (SALICIDE) be used, the resistance of the bitline and wordline may both be reduced further. SALICIDE is commonly used in circuits where low gate and source/drain resistance are required to reduce RC delay and thus increase circuit speed. In such processes, the gate and source/drain are first formed but isolated from each other by a dielectric spacer. Metal such as Ti and Co is deposited on the substrate, in direct contact with Si in the gate, source, and drain region. With thermal annealing, the metal forms metal silicide on the gate, source and drain. After metal that does not react with exposed Si is removed, normally through selective chemical etching, the gate, source and drain silicide are simultaneously formed without any masking step, thus named self-aligned silicide. The invented cell implemented with SALICIDE is shown in FIG. 3(F).

As discussed earlier and illustrated in FIG. 3(D), cell 100 may be implemented with source/drain implant. It should be obvious to one of ordinary skill in the art that cell 200, 400, and 500 may also be implemented with such an implant. Similarly, the heavily doped n+ region 126 may also be used underneath the lightly doped n− region 112 in FIGS. 3(D), (E), and (F). In each case this addition reduces the bitline resistance of the cell.

Figure 5:
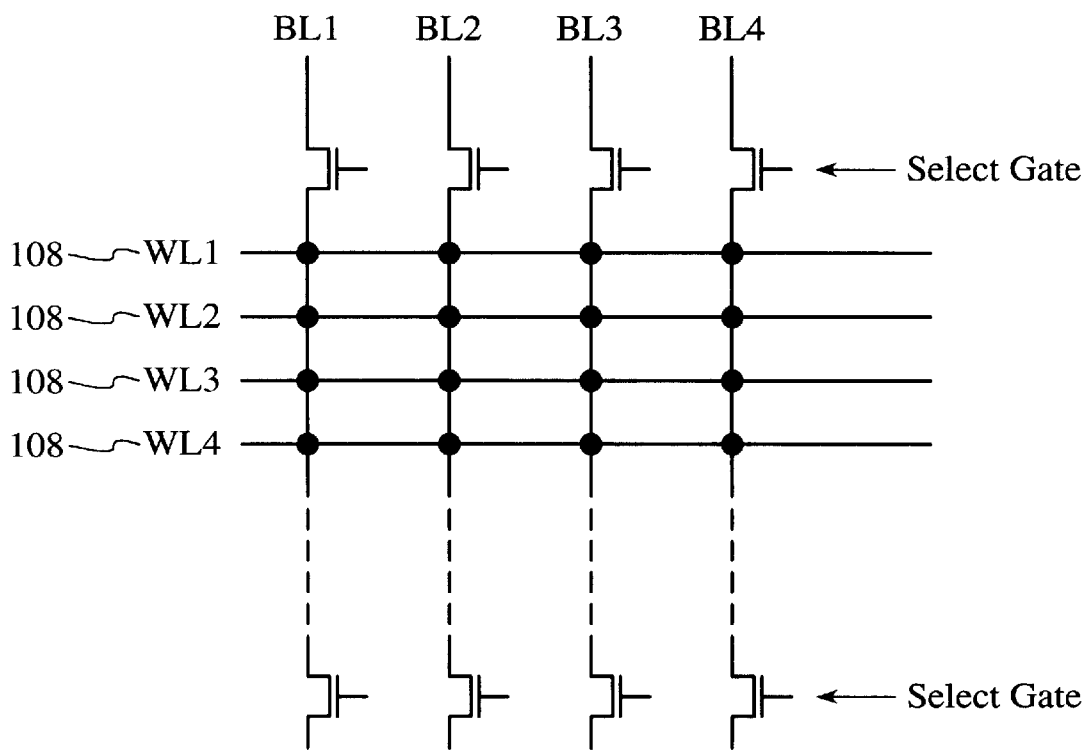
FIG. 5 is a diagram of an array architecture.

Program/Erase Algorithm:

The disclosed cell is both programmed and erased using FN-tunneling, in a fashion similar to that used by the conventional NAND architecture. Program and erase may be understood by examining the array architecture (FIG. 5), in this example configured in a NAND fashion. In this disclosure, program operation is defined as placing charge (electrons) onto the floating gate, whereas erase operation is defined as removing electrons from the floating gate.

Assuming the cell at the intersection of WL2 and BL2 is the "selected" cell, i.e., the cell to be programmed. The program condition is summarized in the following table:

| WL1, WL3, ... (unselected wordlines) | WL2 (selected wordline) | BL1, BL3, ... (unselected bitlines) | BL2 (selected bitline) |
|---|---|---|---|
| intermediate voltage to pass the bitline voltage but not high enough to cause programming | Vpp | intermediate voltage to prevent programming unselected cells | ground |

In the above scheme, programming is achieved by applying Vpp (programming voltage) to the selected wordline (the control gate 108). Vpp is chosen to cause electrons to tunnel from the shallow n− channel 112 (refer to FIG. 3) which is grounded for the selected bitline, into the floating gate 110, through the thin tunnel oxide. A typical Vpp value might be 14 to 18 V. Unselected wordlines are used to pass the bitline voltage, but not high enough to cause programming of unselected bits. Typical bias for unselected wordlines is 8 to 10 V. A selected bitline will be biased at ground so as to have the highest possible voltage across the tunnel oxide to facilitate programming. Unselected bitlines will be biased at Vcc to force channel of unselected bits to have an appropriate potential. This channel potential is used to reduce the electric field across the tunnel oxide, in order to inhibit programming of unselected bits. The exact values of Vpp and voltage values to bias unselected bitlines and wordlines may be easily determined by those skilled in the art, using thickness of the tunnel oxide, the actual cell layout (which affects the gate coupling coefficient), and the thickness and effective dielectric constant of the interpoly dielectric.

It is during this operation, when unselected bitlines are biased at an intermediate voltage, that the absence of abrupt junction in this invention helps to minimize undesirable reliability concerns due to high junction field, as in prior art.

Bulk erase, typically used by FLASH technologies, is adopted. A high voltage is applied to the p-well (122 in FIG. 3) (inside the n-well 124 in a triple-well configuration) with all wordlines grounded. The voltage difference between the floating gate 110 and the channel 112 causes electrons in programmed floating gates to tunnel back into the channel. Erasure may also be implemented with a negative voltage applied to all wordlines to decrease the positive bias on the p-well. Please note that since during erasure a voltage drop is developed across the n− region due to depletion of this region, the erase voltage will be 1 to 2 V higher than if the channel is in accumulation as in most prior art, in order to overcome the voltage drop across the depletion region at the channel surface.

Read Algorithms:

For a programmed cell, electrons are stored in the floating gate 110. An erased cell, on the other hand, has a floating gate 110 in charge-neutral state, i.e., without excess electrons. It may even be over-erased and carry some positive charge. The read operation utilizes the capacitor displacement current:

$$i = C*(dV/dt),$$

where C is the capacitance, V is the voltage applied to a capacitor, and i is the displacement current.

| WL1, WL3, ... (unselected wordlines) | WL2 (selected wordline) | BL1, BL3, ... (unselected bitlines) | BL2 (selected bitline) |
|---|---|---|---|
| V1 | voltage ramp | ground or float | current sensor |

Figure 6:
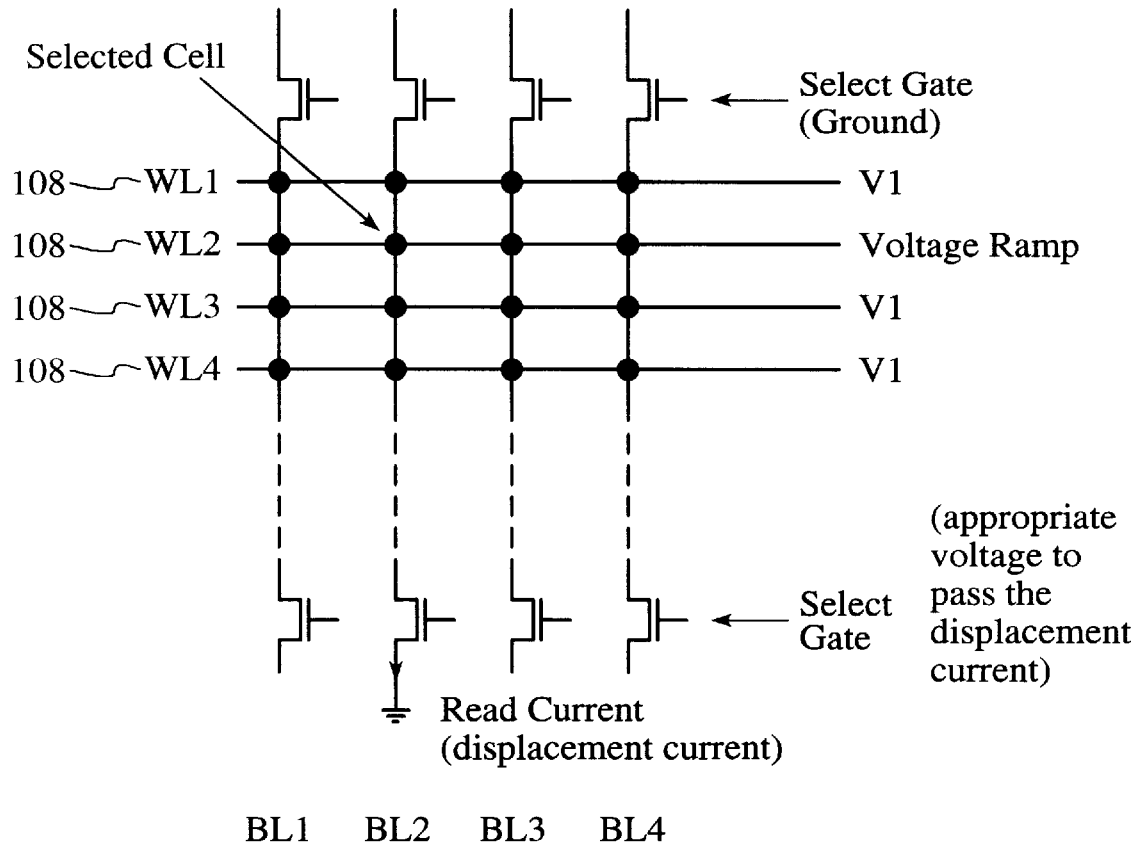
FIG. 6 is a diagram illustrating the read operation using the displacement current sensing.
Figure 8:
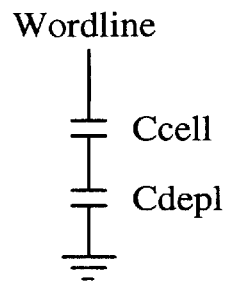
FIG. 8 is the equivalent circuit of a programmed cell during the read operation.
Figures 7A, 7B:
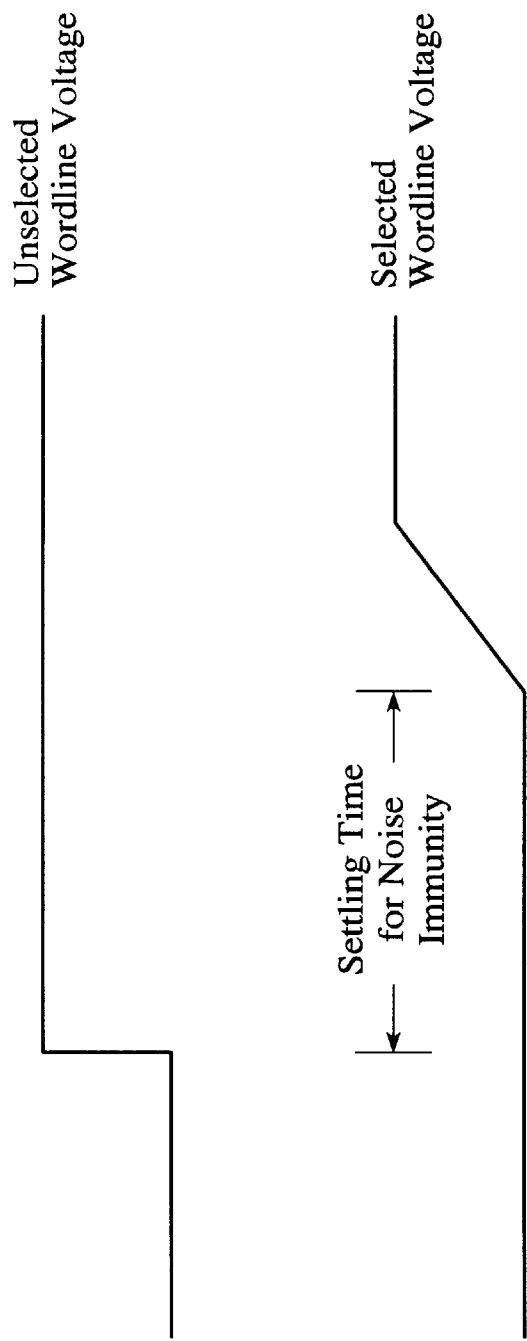
FIGS. 7(A) and 7(B) are diagrams illustrating the wordline timing during the read operation. Bias on unselected wordline is set up before selected wordline to reduce noise.

The read algorithm is shown in FIG. 6. In order to read a cell, V1 is chosen to drive the channel of unselected cells into accumulation. For better noise margin, the unselected wordline voltage V1, and any bias voltage applied to the sense amplifier may be first applied and be allowed to settle before the ramp voltage is applied to the selected wordline, so that any displacement current on the unselected wordline would have settled down to zero. The selected wordline (WL2) then receives a "voltage ramp." The ramp may be for example from ground to not higher than Vt in a matter of tens of nano-second to one micro-second. The timing diagram for this approach is illustrated in FIG. 7. For a programmed cell, the channel is initially depleted. The equivalent circuit of such a cell is in FIG. 8.

Here Ccell denotes the capacitance of the back-to-back double-poly capacitor which consists of the ONO capacitor and the tunnel oxide capacitor in series, and Cdepl is the capacitance of the depletion layer in the n− region 112 in FIGS. 3(A) through (F). This depletion layer is induced by the electrons stored in the floating gate 110. The displacement current of a programmed cell with a ramping voltage on the control gate 108, which can be sensed from the bitline (BL2) in FIG. 6, is:

$$i_{programmed} = (Ccell*Cdepl)/(Ccell+Cdepl)*(dV/dt).$$

Figure 9:
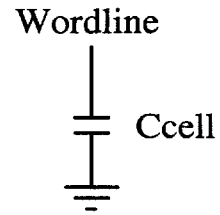
FIG. 9 is the equivalent circuit of an erased cell during the read operation.

An erased cell has an equivalent circuit as shown in FIG. 9. Since the n− region 112 is not depleted for an erased cell at the onset of the voltage ramp, the depletion capacitor does not exist. The displacement current of an erased cell with a ramping voltage on the control gate is therefore:

$$i_{erased} = Ccell*(dV/dt).$$

In effect, the capacitance of the system is the stored information of the memory array. In the preferred embodiment of this invention disclosure, the capacitance of an erased cell can be 2 to 5 times higher than that of a programmed cell, which leads to a large difference in the displacement current since the displacement current is proportional to the capacitance. This difference in this displacement current should provide sufficient margin to distinguish between programmed and erased state of the cell. The sensing circuitry measures the displacement current and compares it with a reference current which should be greater the $i_{programmed}$ but smaller than $i_{erased}$. By determining whether the displacement is greater or smaller than this reference current, the logic state of the cell may be determined accordingly. The sensing circuitry may use the highly sensitive differential sense amplifiers commonly used by memory devices.

ADVANTAGES OF INVENTION

The disclosed invention uses a novel memory cell to implement FLASH EEPROM. It has the following advantages over prior arts:

1. Cell size is highly scalable. It is not susceptible to short-channel effects plaguing all prior arts. Such technology is most suitable for mass-storage applications, where the storage capacity per chip can be greatly increased by this invention, compared with existing FLASH devices fabricated with technologies of similar complexity. Its potential for embedded applications is also unlimited.
2. Low power consumption due to the use of displacement current for read operation. In addition, the sensing of the content of selected cell is less susceptible to read error from the content of the unselected cells.
3. Easy implementation. The double-poly gate structure is similar to an ETOX cell. The channel area does not require any threshold-adjust implant nor any drain engineering as required by all prior arts. No special fabrication technique is needed.
4. Reliable cell operation. The disclosed cell is not susceptible to hot-carrier effect which is especially pronounced in sub-micron transistors. Such effect usually is designed out by careful drain engineering and using conservative read bias conditions which often mandate low cell read current and reduced circuit performance.
5. Proven program/erase algorithm. As discussed earlier, the program/erasure algorithm is similar to that used by the conventional NAND configuration. Its effectiveness has long been proven.

Due to the potentially low cost/MByte offered by the scalability and technology simplicity of this invention, it would become a strong candidate for replacing magnetic hard-disks as the future computer mass-storage medium.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of reading/sensing a FLASH memory cell having a lightly doped n– region, comprising the steps of:
   a) applying a first bias voltage to control gates of unselected cells in an array;
   b) applying a ramp voltage to the control gate of said cell; and
   c) reading (sensing) a displacement current from a bitline of said cell; wherein from the displacement current a capacitance of the lightly doped n– region may be known and from the capacitance of the lightly doped n– region, a stored logic state on the floating gate may be determined.

* * * * *